United States Patent [19]

Kieser et al.

[11] Patent Number: 4,939,424
[45] Date of Patent: Jul. 3, 1990

[54] APPARATUS FOR PRODUCING A PLASMA AND FOR THE TREATMENT OF SUBSTRATES

[75] Inventors: Jörg Kieser, Albstadt; Michael Geisler, Wächtersbach; Rolf Wilhelm, Calw-Stammheim; Eberhard Räuchle, Remseck, all of Fed. Rep. of Germany

[73] Assignee: Leybold Aktiengesellschaft, Hanau, Fed. Rep. of Germany

[21] Appl. No.: 355,886

[22] Filed: May 23, 1989

Related U.S. Application Data

[63] Continuation of Ser. No. 31,103, Mar. 26, 1987, abandoned.

[30] Foreign Application Priority Data

Feb. 21, 1987 [DE] Fed. Rep. of Germany ....... 3705666

[51] Int. Cl.$^5$ .......................... H01J 19/80; H01J 7/46
[52] U.S. Cl. .................................. 315/111.21; 315/39; 315/111.41; 315/3.5
[58] Field of Search ...................... 315/4, 39, 39.3, 3.5, 315/39.51, 39.61, 111.21, 3, 111.41, 111.91; 331/126; 313/231

[56] References Cited

U.S. PATENT DOCUMENTS

| | | | |
|---|---|---|---|
| 3,814,983 | 6/1974 | Weissfloch et al. | 315/39 |
| 3,906,892 | 9/1975 | Van Cakenberghe | 313/231.31 |
| 3,911,318 | 10/1975 | Spero et al. | 315/39 |
| 4,438,368 | 3/1984 | Abe et al. | 315/39 |
| 4,521,717 | 6/1985 | Kieser | 315/39 |

Primary Examiner—Leo H. Boudreau
Assistant Examiner—Michael Razavi
Attorney, Agent, or Firm—Felfe & Lynch

[57] ABSTRACT

The plasma produced by means of microwaves in the presence of a magnetic field and a gas serves to coat a substrate which is situated in a chamber having metal walls. The microwaves are repeatedly reflected at the metal walls, so that the chamber has numerous microwave modes. By means of permanent magnets, which are placed either inside the chamber or outside the chamber in the vicinity of the substrate that is to be coated, it is possible to produce within this chamber an electron-cyclotron resonance which permits a locally controlled ignition of the plasma.

35 Claims, 4 Drawing Sheets

FIG. 3
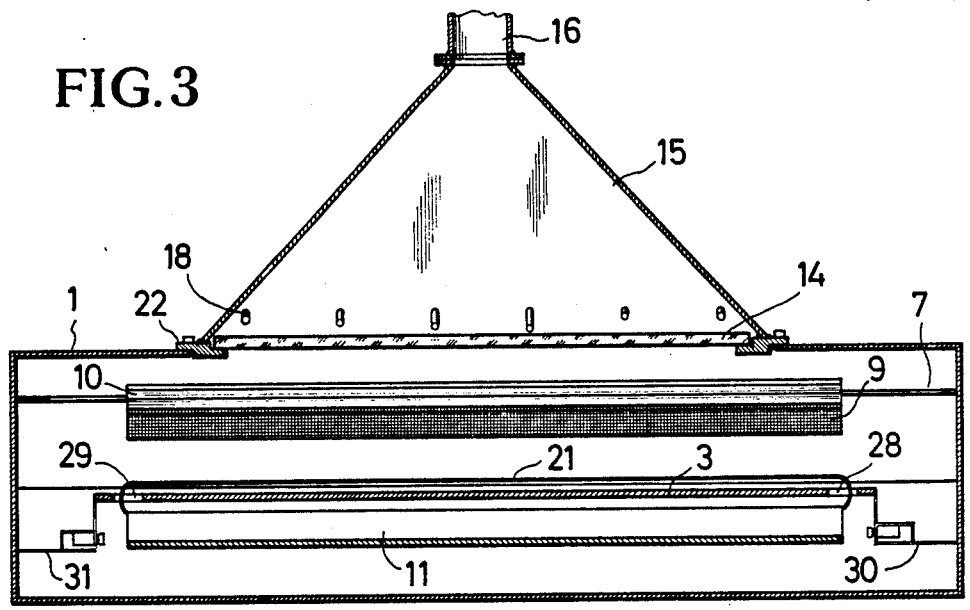
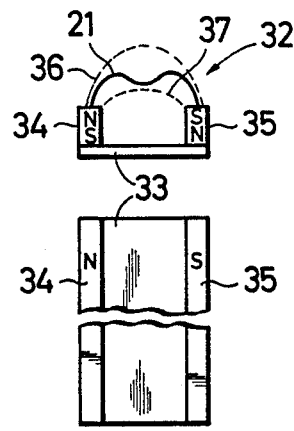
FIG. 4a
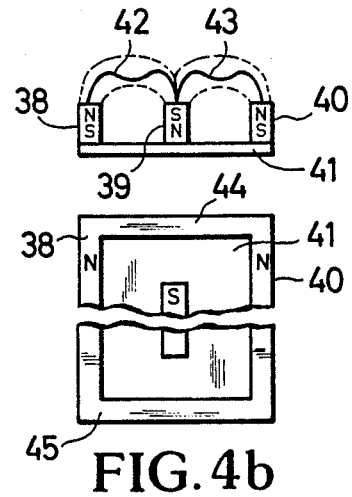
FIG. 4b
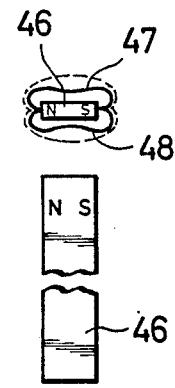
FIG. 4c
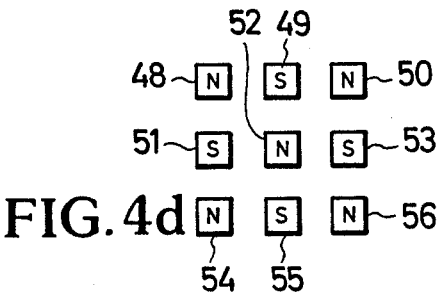
FIG. 4d
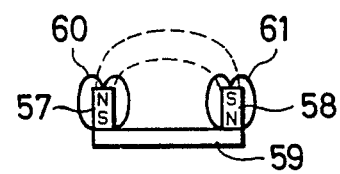
FIG. 4e

APPARATUS FOR PRODUCING A PLASMA AND FOR THE TREATMENT OF SUBSTRATES

This application is a continuation of application Ser. No. 031,103, filed Mar. 26, 1987, now abandoned.

BACKGROUND OF THE INVENTION

The invention relates to an apparatus for producing a plasma and for the treatment of substrates therein. The apparatus includes a microwave generator, a gas containing chamber in which the substrate is coated, and a magnet system for the production of local electron-cyclotron resonances.

In numerous fields of technology it is necessary to apply very thin coatings of pure substances to certain objects. An example is window glass which is provided with a thin coating of metal or metal oxide in order to filter certain wavelength ranges out of sunlight. In semiconductor technology, thin coatings of one or more substances are often applied to a substrate. It is especially important that the thin coatings not only be pure, but also that they be precisely measured out so that the coating thicknesses—and, in the case of coatings of chemical compounds, their composition—will be accurately repeatable. These coating thicknesses are, as a rule, between two and several thousands of nanometers.

A variety of methods are known for applying thin coatings to films, glass and other substrates. In a first method, the thin coating is applied by chemical or electrochemical deposition, while in a second method the coating is applied by evaporation in a vacuum. With evaporation it is difficult to provide large areas with very thin coatings with the required uniform precision and repeatability, and consequently a third method, known as the sputtering or cathode spraying process, is used. For the deposition of a thin coating from the gas phase, sputtering is, of course, unsuitable.

To be able to deposit a pure substance or a chemical compound from the gaseous phase, the substance or compound is converted to the plasma state. The radicals formed in the plasma deposit themselves on the substrate. For the production of such a plasma, different forms of electrical energy can serve. For example it is possible to use direct currents, low-frequency alternating currents or corona discharges for the production of plasmas. Especially advantageous is the production of plasma by microwaves, because in this case no electrodes are needed, which can contaminate and become ablated, and because the plasma produced by microwaves has a greater density of ions and radicals and therefore can be kept at a higher pressure than the plasma produced by other methods. Furthermore, the chemical structure of starting monomers can be preserved at least partially. Lastly, the microwave plasma is also favored for the establishment of cold cathode ion sources.

It is true that usually only small volumes of plasma can be produced by microwaves, because the apparatus by which the microwave energy is delivered to the plasma—e.g., antennas, waveguides and cavity resonators—do not permit the production of large volumes of plasma. To produce a gas plasma, the delivered electrical field strength must exceed the electrical breakdown field strength of the gas. Since the breakdown field strength increases with increasing gas pressure, high electrical field strengths are necessary at high pressures.

An apparatus for the production of plasmas by means of electromagnetic radiation is known, with which high field strengths are produced (U.S. Pat. No. 3,814,983).

In this apparatus a delay line, i.e., a microwave conductor of low group velocity ("slow wave structure") is used for the purpose of feeding the electrical energy to the plasma, the energy source being located outside of the receptacle and its electrical field passing through the receptacle wall. This delay line consists of a "semiradiating" system about 90 cm long, which operates in the degenerate $\pi/2$ mode or close to the degenerate $\pi/2$ mode. Operation in the vicinity of the band edge, i.e., either in the degenerate $\pi/2$ mode or in the $\pi$ mode, leads to especially strong electrical fields in the vicinity of the delay line. The reason for this lies in the circumstance that the electrical field strength is inversely proportional to the group velocity of the wave, which in the vicinity of the edge of the band assumes a very small value. Furthermore, in this system the electrical field strength decreases with the distance perpendicular to the plane of the delay line. It is true that with this apparatus no large-volume plasmas with a very large, uniform plasma zone can be produced. It follows that the rate of deposit of polymers is irregular across the entire substrate width in the known apparatus. Moreover, interactions take place between the waves, which occur in the delay line, in the window dielectric and in the plasma; i.e., poorly understood interferences develop, which adversely affect the configuration of the plasma zone.

To equalize the rate of deposition in the case of polymers it has already been proposed, in an apparatus according to U.S. Pat. No. 3,814,983, that, in addition to the known delay line, at least a second elongated delay line be disposed on the same side of the substrate (German Federal Pat. No. 31 47 986). But this "crossed structures" arrangement has the disadvantage that the strongest plasma burns directly at the inside of the microwave window where the microwave is injected, and this results in an especially great and undesirable coating of this window.

Furthermore, an apparatus is known whereby a plasma is produced by means of a high-frequency wave which is injected into a waveguide in which a glass tube is situated in which the plasma is produced (German Federal OS No. 31 44 016), to which U.S. Pat. No. 4,438,368 corresponds. Around the plasma producing tube there is in this case provided a coil which produces a magnetic field along the axis of the glass tube. At a circuit frequency $\omega$ of the high-frequency field, and a magnetic flux density B, the electron-cyclotron resonance frequency will be $\omega = e \times B/m$. At this resonance frequency the coupling of the high-frequency wave to the plasma electrons is especially strong. It is a disadvantage even in this known device, however, that only relatively small plasma zones can be produced. Furthermore, the glass tube easily takes on coatings deposited from the gas phase.

It is therefore the object of the invention to create an apparatus whereby it will be possible on the one hand to produce a uniform, large-volume plasma, and on the other hand to keep the plasma away from the microwave window.

SUMMARY OF THE INVENTION

This problem is solved in accordance with the distinctive. The chamber has metal walls and an entry window for the microwaves. The magnetic field of the magnetic system is disposed in the chamber at a given distance from the substrate, especially in the fact that large-area, uniform plasmas can be produced. Another advantage is that no deposits form on the entry window. These advantages are due to the fact that the magnetic field produced by the magnet systems is strong enough, at least in some areas, to permit a so-called electron-cyclotron resonance. Use is made of the fact that the electrical field strength that is necessary for the ignition of the plasma in a region in which the electron cyclotron resonance can take place is considerably smaller than in a region free of a magnetic field. Through the localization of the magnetic field sufficient for the electron cyclotron resonance, it is thus possible also to produce a corresponding localization of the plasma production. Furthermore, the apparatus according to the invention is especially suitable for the coating of substrates moving in a continuous linear manner.

Embodiments of the invention are represented in the drawing and are further described hereinbelow.

BRIEF DESCRIPTION OF THE DRAWING

FIG. 3 is a cross section of the embodiment shown in FIG. 1, FIGS. 4a–e represent various permanent magnet arrangements.

DETAILED DESCRIPTION OF THE PREFERRED EMBODIMENTS

Figure 1:
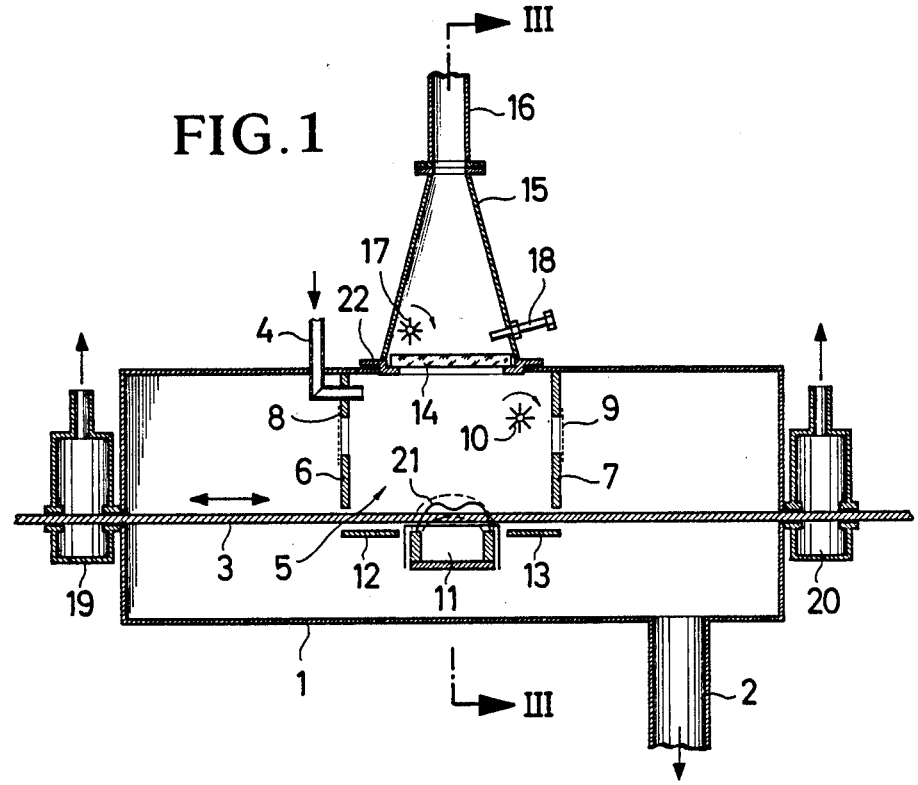
FIG. 1 is a diagrammatic representation of a first embodiment of the invention.

FIG. 1 shows a plan view of a first variant of the invention. In a housing 1, which can be evacuated through a connection 2, there is disposed a linearly movable support 3 with a substrate that is to be coated. The coating is performed by means of a gas which is fed into a chamber 5 through an inlet connector 4 and is there ionized. The chamber 5 has walls of metal, of which walls 6, 7, 12 and 13 can be seen in FIG. 1. The lateral walls 6 and 7 have each a mesh 8, 9, which is permeable to microwaves and which assures the transparency of the chamber 5 for a gas exchange. Also provided in the chamber 5 is a rotatable metal reflector 10 which is in the form of a paddle wheel. Behind the substrate support 3 there is disposed a magnet system 11 which is situated between two metal boundary walls 12 and 13. Opposite this magnet system 11 is a microwave window 14, preferably of quartz glass, through which the microwaves from a horn radiator 15 enter into the gas chamber 5. This horn radiator 15 is in turn connected to a microwave conductor 16 which in turn is connected to a microwave transmitter which is not represented. The microwave power immediately behind the microwave window 14 is made such that it does not result in spontaneous ignition of the plasma in the window area.

In the horn radiator 15, which rests on a flange 22, a rotatable metal reflector 17 is disposed, and rods 18 of metal or of a dielectric are disposed opposite the reflector so as to influence the field distribution. The housing 1 is sealed off at both ends by pressure chambers 19 and 20 which serve as seals for the substrate support 3. The operation of the apparatus represented in FIG. 1 is as follows:

The microwave power radiated in the form of a lobe by the horn radiator 15 is injected into the chamber 5 formed by the metal walls and repeatedly reflected on the walls 6, 7, 12 and 13 and on the substrate support 3. This causes a number of standing waves with nodes and crests in different positions to form in chamber 5, if for the moment the absorption of the waves by the plasma is disregarded. The great number of standing waves is also referred to as a multimode system. The superimposition of many individual vibrations results in a wave field which is substantially more uniform than the lobe radiated by the horn radiator 15. An additional mixture of waves or modes can be achieved by the rotating metal reflectors 10 and 17 which are like wave agitators, so to speak. Essential for the invention is the magnet system which, in the example of FIG. 1, is disposed behind the substrate support 3. It is by means of this magnet system that the electron-cyclotron resonance is produced. The gas particles ionized by the microwaves are drawn by the Lorenz force into a path curving around the magnetic lines of force. The frequency of the rotation of a charged particle in a homogeneous magnetic field is independent of its radius of curvature if the velocities are not too great, and it depends only on the specific charge of the particle and the magnetic flux density. Thus, the known cyclotron resonance frequency applies:

$$f = \frac{e_o \cdot B}{2 \cdot \pi \cdot m}$$

wherein f is the frequency of rotation of the particle, $e_o$ is the particle's charge, m the mass of the particle and B the magnetic flux density. In the case of a microwave frequency of 2.45 GHz coming from the horn radiator 15, in order to achieve the electron-cyclotron resonance frequency, a magnetic flux density of B=0.088 Vs/m$^2$=800 Gauss is necessary in order to create such conditions in the plasma chamber 5 that the frequency of rotation of an electron about the lines of force of the magnetic system will be in phase with the exciting frequency of the microwave. The positive and negative half-waves of the electrical field of the microwave are situated relative to the momentary position of the electron such that it is always accelerated. In this manner it is possible, as it is known in cyclotron technology, to accelerate electrons to very high energies as long as care is taken that these electrons do not collide with residual gas particles. For further details on the interaction between plasma and electromagnetic fields refer to the related technical literature (e.g., Bergmann/-Schafer, Lehrbuch der Experimentalphysik, Vol. IV, part 2, Aufbau der Materie, 1975, p. 1429 ff.).

In the case of the invention it is not the object to prevent collisions of the electrons with gas particles in order to bring the electrons to a high energy level; instead, such collisions are even desirable in order to produce radicals and ions by collision. In the case of a very frequent collision of electrons and gas particles, however, one can scarcely speak any more of a cyclotron resonance, because for this at least one complete revolution of the electrons has to be present before the collision takes place. This minimum of one revolution is achieved if the pressure of the gas is not all too high. As experiments have shown, the best results are obtained at a gas pressure in the $10^{-3}$ mbar range.

The magnetic flux density necessary for cyclotron resonance in coupling to a microwave of 2.45 GHz is, as mentioned, 0.088 Tesla. Permanent magnets especially suited for the production of such a flux density have proven to be high power permanent magnets such as CoSm or Nd-Fe-B magnets. If such permanent magnets are used in the magnet system of FIG. 1, a cyclotron resonance is obtained in the region 21 represented in solid lines. Consequently the plasma is ignited in this region, i.e., there is no plasma present at the window 14 that will result in a deposit thereon. With the invention it is therefore possible to locate the plasma where it is wanted, namely at the substrate support 3.

For a number of applications, however, it is a disadvantage in this case that only largely planar substrates can be coated, because for practical reasons the zone 21 of cyclotron resonance cannot be produced much farther away than about 20 mm above the magnet poles.

Figure 2:
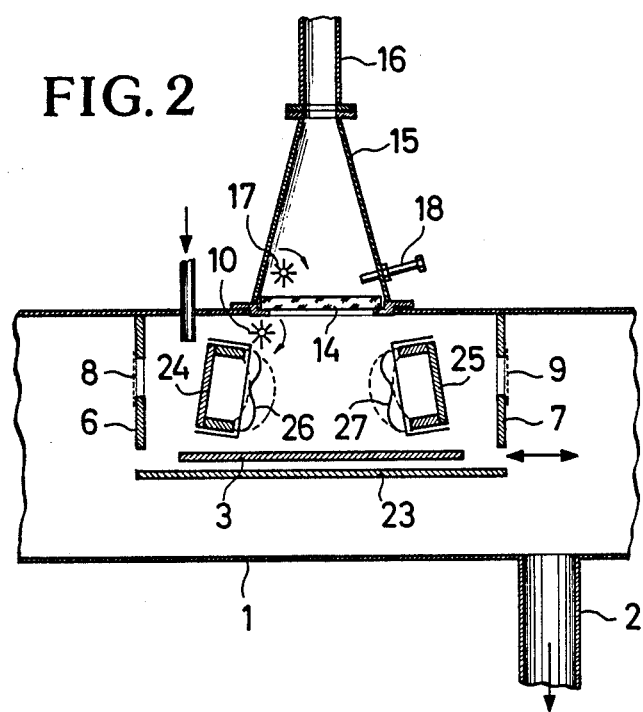
FIG. 2 is a diagrammatic representation of a second embodiment of the invention.

One possibility for getting around this disadvantage is shown in the apparatus of FIG. 2. In this apparatus a plasma is produced in front of the substrate support 3, so that even decidedly three-dimensional substrates can be coated. The magnet arrangement here consists of two systems 24 and 25 which are arranged in symmetry with an imaginary straight line along the axis of the waveguide 16 and of the horn radiator 15. In this case two cyclotron resonance regions 26 and 27 form, which serve as ignition zones for the plasma. The two metal boundary walls 12 and 13 according to FIG. 1 are replaced in FIG. 2 by a single boundary wall 23.

In FIG. 3 the apparatus of FIG. 1 is represented in a cross section taken along line III—III. It can be seen that several rods 18 have been screwed to different depths in the horn radiator 15. With these rods 18 the microwave field can be influenced in the sense that it can be controlledly curved. The mesh 9 is now plainly visible beside the microwave agitator 10. Openings 28 and 29 are provided in the substrate support 3 through which the ignited plasma front 21 strikes. The substrate support 3 is mounted on the loops 30, 31.

FIGS. 4a to 4e show different permanent magnet arrangements which are suitable for the magnet system 11. The sketches in the upper part of the figure are profiles while those in the lower part are plan views.

In FIG. 4a is shown a U-shaped permanent magnet 32 which has two legs joined together by a yoke 33. The area of cyclotron resonance is indicated at 21. The broken lines 36 and 37 represent magnetic lines of force on which no cyclotron resonance takes place. The legs 34 and 35 are bar magnets each with a north and south pole, the position of north and south pole in leg 34 being the opposite of that of leg 35. The magnetic field of the arrangement in FIG. 4a exercises a leveling effect on the thickness of the deposited layer in the lengthwise direction, which appears to be attributable to a cooperative drifting of the electrons, such as is known in the magnetron art. The $E \times B$ movement known in the sputtering magnetron is lacking because there is no constant E field perpendicular to the B field. However, a drive movement lengthwise of the magnetic field arrangement can be assumed, which is due to the great decrease of the B field above and below the cyclotron resonance surface. The resulting force is then $F \approx \Delta B \times B$. This resultant force furthermore brings it about that the plasma burns well in front of a substrate support which covers the magnetic field-producing apparatus only if the substrate support has slots in the area of the face of the magnet system, as represented in FIG. 3.

Another permanent magnet arrangement is shown in FIG. 4b. Here three bar magnets 38, 39 and 40 with alternating north and south poles are arranged side by side on a common yoke 41. In this manner a linearization of the cyclotron resonance zone is obtained, because then two small resonance arcs 42, 43 are disposed side by side. As it can be seen from the lower part of the sketch, the two outer bar magnets 38 and 40 are joined together by legs 44 and 45. The arrangement in FIG. 4b is also called a "race-track" arrangement.

FIG. 4c shows a single bar magnet 46 which forms two cyclotron resonance regions 47 and 48. From the lower sketch it can be seen that the north pole and south pole are at a relatively short distance from one another compared with the total length of the north pole and south pole. In general, a very large-area configuration of the 0.088 Tesla region will be desired. This, however, requires a magnet mass that is greater than that required for a conventional magnetron magnetic field by a factor of about 3.

FIG. 4d shows a so-called "matrix" arrangement of magnets, in which a total of nine permanent magnets 48–56 are arranged at equal distances from one another and with alternating polarity.

In FIG. 4e there is shown a permanent magnet system similar to the one in FIG. 4a. In this case, however, the permanent magnets 57 and 58 joined by the yoke 59 form a cyclotron resonance region 60, 61, around their own north pole-south pole alignment. This is a magnet system equipped with simple components, such as is used for sputtering magnetrons, in which the electron-cyclotron resonance takes place around the individual magnets.

In addition to its function of providing for a resonance, the magnetic fields serve the function of a magnetic trap, in a manner similar to the normal magnetic circuit; i.e., the plasma is concentrated in the region of the magnetic field.

Figure 5:
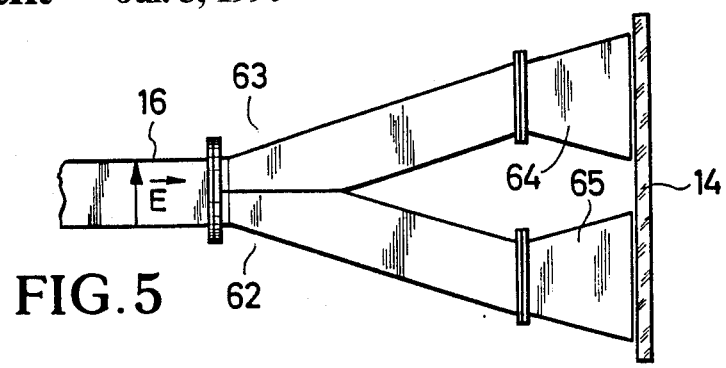
FIG. 5 shows a distributor for a microwave.

FIG. 5 shows an apparatus in which a waveguide 16 is divided into two waveguides 62 and 63. Each of the latter waveguides 62 and 63 terminates in its own horn radiator 64, 65. A plurality of horn radiators can be created in like manner, whose combined wave field is substantially more uniform than that of a single horn radiator.

Figure 6:
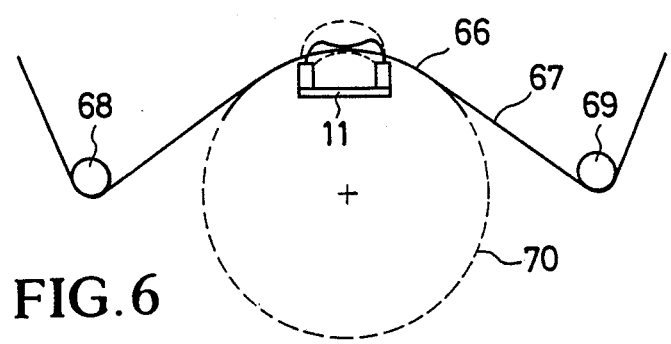
FIG. 6 shows an arrangement for the coating of materials that can be wound on spools.

FIG. 6 represents schematically the manner in which spoolable materials can be coated with the apparatus according to the invention. In this case the representation of the injection of the microwave has been omitted. All that is shown is the magnet system 11 as well as a portion of a roller guide for the spoolable material 67 which is guided over rollers 68 and 69. The roller 66 in this case extends over the circumference of the indicated circle 70.

Figure 7:
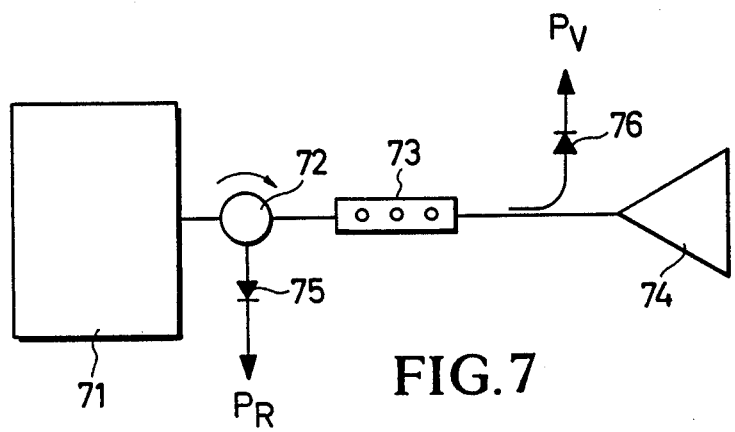
FIG. 7 shows a microwave transmitter system.

FIG. 7 shows schematically the arrangement of the microwave transmitter system which is used in the invention. It has a microwave generator 71 which is connected by a circulator 72 and a three-rod tuner 73 to a horn radiator 74. A device 75 for measuring the reflected power is connected to the circulator. This device is symbolized by a diode. Between the three-rod tuner 73 and the horn radiator 74 there is connected an additional meter 76 by which the forward power is measured. This meter 76 is also represented simply by a diode.

The injection of the microwave power can be performed from a simple, unterminated hollow conductor, for in this case a certain part of the microwave power issues from one end. Due to the abrupt transition, however, some reflection of the microwave output passes into the hollow conductor. An almost complete radiation can be achieved by gradual transition, as a uniform flaring of the hollow conductor towards a horn. In the present case, where a reflection of 5 to 10% of the radiated power is still acceptable, an approximation of the shape represented in FIGS. 1, 2 and 3 is entirely sufficient.

Figure 8A:
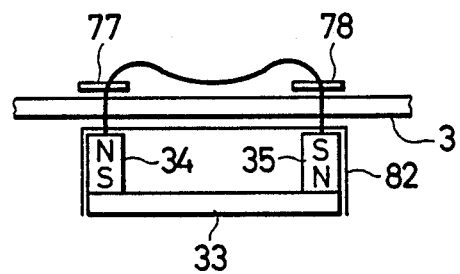
FIGS. 8a–b represent a permanent magnet arrangement and a substrate that is to be coated.
Figure 8B:
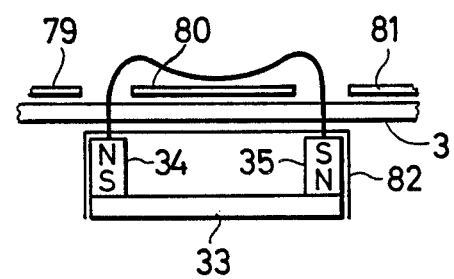

In FIGS. 8a and 8b additional shields 77, 78, 79, 80 and 81 are provided by which it can be brought about that ion-supported deposition can be performed (FIG. 8b) or that deposition is performed without simultaneous ion bombardment (FIG. 8a). Here the magnet system, as in the case of the magnet systems of the previous figures, is provided with a covering 82. If there are enough rotations of the electrons between the collisions in the range of the electron-cyclotron resonance frequency, the electrons can assume high kinetic energies. Since the magnetic field offers no resistance to their movement in the direction of the lines of force, in the embodiments represented in FIGS. 1 and 3, the area of the substrate in which the lines of force break through is exposed to a corresponding electron bombardment, which leads, due to the resultant negative charge, the so-called "self-bias," to a corresponding bombardment of this area by positive ions. This ion bombardment can be controlled by the shields.

The embodiments of the invention represented in the drawing can be varied in many ways. For example, the position of the plane of the microwave window 14 relative to the plane of the substrate is not limited to the parallelism represented in FIGS. 1 to 3. Instead, the described configuration of a multimode state in chamber 5 can be achieved by any desired position of the microwave window 14. What is important is only the relationship between the substrate surface to be treated and the region of electron-cyclotron resonance.

Neither do the magnetic pole faces need, as represented in FIGS. 4a, b, c, d and e, to lie in a single plane. Furthermore, a staggering in depth can be performed by situating all north pole faces in a first plane and all south pole faces in a different second plane. Also the distances between the north poles and south poles can be made variable.

We claim:

1. Apparatus for producing a plasma and treating substrates therein comprising
   a microwave generator;
   a chamber having metal walls and an entry window which admits microwave from said generator, said entry window being impermeable to gas;
   means for promoting a substantially uniform wavefield throughout said chamber;
   means for introducing a gas into said chamber;
   a magnet system for producing a magnetic field within said chamber, said magnetic field being sufficient to produce, in combination with said wavefield and a gas introduced into said chamber, a region of electron-cyclotron resonance within said chamber, said magnet system being movable so that the location of the magnetic field in the chamber is freely selectable, whereby, a region of plasma may be freely located in said chamber.

2. Apparatus according to claim 1 further comprising a substrate support which is movable relative to the magnet system.

3. Apparatus according to claim 3, characterized in that the entry window consists of quartz glass.

4. Apparatus according to claim 1, characterized in that said microwave generator comprises a horn radiator, a microwave guide, and a microwave transmitter, the entry window adjoining said horn radiator which is connected to said microwave guide which in turn in coupled to said microwave transmitter.

5. Apparatus according to claim 2, characterized in that the substrate support is disposed in the chamber opposite from the quartz window.

6. Apparatus according to claim 2, characterized in that the magnet system is disposed on that side of the substrate support which faces away from the entry window, and that the condition for the electron-cyclotron resonance is fulfilled between the substrate support and the window.

7. Apparatus according to claim 2, characterized in that the magnet system is disposed between the entry window and the substrate support.

8. Apparatus according to claim 2, characterized in that two magnet systems are provided between the entry window and the substrate support, which systems are arranged in mirror-image symmetry with respect to an imaginary plane perpendicular to the substrate support.

9. Apparatus according to claim 1, characterized in that the chamber has mesh openings for a gas exchange.

10. Apparatus according to claim 3, characterized in that the magnet system is a permanent magnet system comprising at least one permanent magnet.

11. Apparatus according to claim 1, characterized in that said means for promoting a uniform wavefield comprises at least one microwave agitator provided in the chamber.

12. Apparatus according to claim 1, characterized in that the region in which the electron-cyclotron resonance occurs is situated at least 10 mm in front of the pole faces of the magnet system.

13. Apparatus according to claim 3, characterized in that said means for introducing said gas comprises at least one gas feed opening in said chamber.

14. Apparatus according to claim 4, characterized in that said means for promoting a uniform wavefield comprises at least one microwave agitator provided in the horn radiator.

15. Apparatus according to claim 14, characterized in that the microwave agitator is in the form of a rotatable metal reflector.

16. Apparatus according to claim 1, further comprising an evacuable casing, the chamber being situated inside of said evacuable casing.

17. Apparatus according to claim 16, characterized in that the evacuable casing has openings through which a substrate in band form can be transported and that sealing means are provided at these openings.

18. Apparatus according to claim 4, characterized in that said means for promoting a substantially uniform wavefield comprises a metal rod that can be screwed into the wall of the horn radiator.

19. Apparatus according to claim 1, further comprising a substrate support having openings through which the electron-cyclotron resonance can reach the magnet system.

20. Apparatus according to claim 10, characterized in that said permanent magnet system has two permanent magnets and a yoke, one magnet resting with its south pole on the yoke and the other magnet with its north pole on the yoke.

21. Apparatus according to claim 10, characterized in that the permanent magnet system has three permanent magnets of which the two outer magnets are connected together by legs and enclose the inner magnet, thereby forming a racetrack arrangement.

22. Apparatus according to claim 10, characterized in that the permanent magnet system comprises a plurality of permanent magnets which are disposed equidistantly and have pole ends which differ from one another as regard polarity from the pole ends of the adjacent individual magnets.

23. Apparatus according to claim 3, characterized in that said microwave generator comprises a plurality of horn radiators which are supplied with microwave through dividers.

24. Apparatus according to claim 1, characterized in that the microwave generator comprising a microwave transmitter, a circulator, a tuner, and a horn radiator, said microwave transmitter being connected through said circular and said tuner to said horn radiator.

25. Apparatus according to claim 24, characterized in that said microwave generator further comprises, between the microwave transmitter and the horn radiator a measuring device for measuring the reflected power and a measuring device for measuring the forward power.

26. Apparatus according to claim 10 characterized in that said magnet system comprises a plurality of permanent magnets having pole faces that are variable both in the direction of depth and in their distance apart.

27. Apparatus according to claim 1 further comprising shielding through which the magnetic lines of force pass.

28. Apparatus according to claim 1 further comprising a shielding arranged so that the region of the magnetic field in which the electro-cyclotron resonance occurs lies outside of the shielding.

29. Apparatus according to claim 1, further comprising a roll for the coating of spoolable material, at least a portion of said roll being situated in the chamber, said magnet system being so disposed that the region of the electron-cyclotron resonance lies outside of the roll and above the area of contact between the spoolable material and roll.

30. Apparatus according to claim 1, further comprising means for maintaining the process pressure of the gas between $1\times10^{-4}$ and $1\times10^{-2}$ mbar.

31. Apparatus as in claim 1 wherein said means for promoting a substantially uniform wavefield throughout said chamber comprises said metal walls of said chamber, said metal walls being arranged to cause repeated reflections of the microwave power received through the entry window so that a number of standing waves are formed with nodes and crests in different positions in the chamber.

32. Apparatus as in claim 1 wherein said magnet system comprises a north pole and a south pole arranged so that the magnetic field lines therebetween are curved within said chamber.

33. Apparatus as in claim 11 wherein said microwave agitator is in the form of a rotatable metal reflector.

34. Apparatus as in claim 1 wherein said microwave generator comprises a plurality of horn radiators arranged to inject microwave through said entry window.

35. Apparatus as in claim 34 wherein said means for promoting said substantially uniform wavefield comprises said plurality of horn radiators.

* * * * *

UNITED STATES PATENT AND TRADEMARK OFFICE
CERTIFICATE OF CORRECTION

PATENT NO. : 4,939,424
DATED : July 3, 1990
INVENTOR(S) : Jörg Kieser

It is certified that error appears in the above-indentified patent and that said Letters Patent is hereby corrected as shown below:

Column 2, lines 66 and 67, delete "This problem is solved in accordance with the distinctive". --

Column 3, line 2, after "substrate", delete "," and insert --.
The advantage achieved with the invention consists --.

Column 8, line 1,(claim 3), change "according to claim 3" to --according to claim 1 --.

Column 8 and 9, New claims 10, 13, and 23, change "according to claim 3" to --according to claim 1 --.

Signed and Sealed this

Fourteenth Day of September, 1993

Attest:

BRUCE LEHMAN

Attesting Officer

Commissioner of Patents and Trademarks